(12) United States Patent
Seif et al.

(10) Patent No.: US 10,516,087 B2
(45) Date of Patent: Dec. 24, 2019

(54) TERRESTRIAL VEHICLE LIGHT-EMITTING MODULE

(71) Applicant: VALEO VISION, Bobigny (FR)

(72) Inventors: Lothar Seif, Bobigny (FR); Christine Roucoules, Bobigny (FR); Gilles Briand, Bobigny (FR); Benoit Reiss, Bobigny (FR); Zdravko Zojceski, Bobigny (FR)

(73) Assignee: VALEO VISION, Bobigny (FR)

( * ) Notice: Subject to any disclaimer, the term of this patent is extended or adjusted under 35 U.S.C. 154(b) by 0 days.

(21) Appl. No.: 15/656,683

(22) Filed: Jul. 21, 2017

(65) Prior Publication Data
US 2018/0023779 A1 Jan. 25, 2018

(30) Foreign Application Priority Data
Jul. 22, 2016 (FR) .................................. 16 57040

(51) Int. Cl.
*H01L 33/64* (2010.01)
*H01L 27/15* (2006.01)
(Continued)

(52) U.S. Cl.
CPC .......... *H01L 33/648* (2013.01); *F21S 41/141* (2018.01); *F21S 43/14* (2018.01); *F21S 45/47* (2018.01); *H01L 27/153* (2013.01); *H01L 33/32* (2013.01); *H01L 33/62* (2013.01); *H01L 33/64* (2013.01); *H01L 33/641* (2013.01); *H01L 33/642* (2013.01); *H01L 33/644* (2013.01);
(Continued)

(58) Field of Classification Search
CPC ....... H01L 33/64; H01L 33/648; H01L 27/15; H01L 27/153
See application file for complete search history.

(56) References Cited

U.S. PATENT DOCUMENTS 9,255,702 B2 * 2/2016 Singer .................. H05K 3/0061
2006/0196651 A1 * 9/2006 Board ..................... F28D 15/02
165/177
(Continued)

FOREIGN PATENT DOCUMENTS

EP 2 390 930 A2 11/2011
FR 2560731 * 5/1984
(Continued)

OTHER PUBLICATIONS

French Preliminary Search Report dated Apr. 5, 2017 in French Application 16 57040 filed on Jul. 22, 2016 (with English Translation of Categories of cited documents).

*Primary Examiner* — Fazli Erdem
(74) *Attorney, Agent, or Firm* — Oblon, McClelland, Maier & Neustadt, L.L.P.

(57) ABSTRACT

The invention notably relates to a light-emitting module of a terrestrial vehicle having at least one semiconductor light source including a mostly semiconductor material substrate, the substrate having a first face and a second face. The light source further includes electroluminescent elements with submillimeter dimensions extending from the first face of the substrate, and at least one heatsink cooperating with the second face of the substrate to evacuate the heat produced by the light source. The invention therefore offers an improved light-emitting module for terrestrial vehicles.

17 Claims, 4 Drawing Sheets

(51) Int. Cl.
  *H01L 33/32* (2010.01)
  *H01L 33/62* (2010.01)
  *F21S 41/141* (2018.01)
  *F21S 43/14* (2018.01)
  *F21S 45/47* (2018.01)
  *H01L 25/16* (2006.01)
  *H01L 33/00* (2010.01)
  *H01L 33/24* (2010.01)
  *H05K 1/02* (2006.01)
  *H01L 25/075* (2006.01)
  *H01L 33/08* (2010.01)

(52) U.S. Cl.
  CPC ........ *H01L 25/0753* (2013.01); *H01L 25/167* (2013.01); *H01L 33/007* (2013.01); *H01L 33/08* (2013.01); *H01L 33/24* (2013.01); *H05K 1/028* (2013.01)

(56) References Cited

U.S. PATENT DOCUMENTS

| | | | |
|---|---|---|---|
| 2008/0023722 A1* | 1/2008 | Lee | H01L 33/648 257/99 |
| 2011/0204327 A1* | 8/2011 | Hiruma | H01L 27/153 257/13 |
| 2011/0254034 A1 | 10/2011 | Konsek et al. | |
| 2011/0291072 A1 | 12/2011 | Kim | |
| 2013/0048945 A1 | 2/2013 | Fang et al. | |
| 2013/0049018 A1* | 2/2013 | Ramer | H01L 31/052 257/81 |
| 2013/0049040 A1* | 2/2013 | Ramer | H01L 33/50 257/98 |
| 2013/0049041 A1* | 2/2013 | Ramer | H01L 31/024 257/98 |
| 2014/0239327 A1 | 8/2014 | Konsek et al. | |
| 2015/0084490 A1* | 3/2015 | Fujiwara | G06F 1/203 312/236 |
| 2015/0221825 A1* | 8/2015 | Ko | H01L 33/24 257/98 |
| 2016/0056336 A1* | 2/2016 | Hwang | H01L 33/24 257/9 |
| 2016/0064607 A1 | 3/2016 | Yoo et al. | |
| 2017/0261749 A1* | 9/2017 | Briand | G02B 27/0176 |

FOREIGN PATENT DOCUMENTS

| | | | |
|---|---|---|---|
| FR | 2635430 | * | 12/1988 |
| WO | WO 2010/014032 A1 | | 2/2010 |

* cited by examiner

TERRESTRIAL VEHICLE LIGHT-EMITTING MODULE

FIELD OF THE INVENTION

The invention relates to the field of terrestrial vehicle light-emitting modules, i.e. modules that can be integrated into a light-emitting device of the vehicle and, when the vehicle is used, enable projection of light illuminating the road or the passenger compartment and/or enabling the vehicle to be rendered more visible. Examples of such light-emitting devices are position lights or low beam and/or high beam lights (commonly called "headlights").

BACKGROUND

The terrestrial vehicle is equipped with light-emitting devices, notably lighting and/or signaling devices, such as headlights or rear lights, intended to illuminate the road in front of the vehicle, at night or in the event of reduced brightness. They can also serve to light the passenger compartment of the vehicle. These light-emitting devices can comprise one or more light-emitting modules. Each lighting function can be provided by one or more modules. Moreover, in these terrestrial vehicle light-emitting modules, the light sources are more and more frequently light-emitting diodes (LED), notably for advantages of overall size and service life compared to conventional light sources.

The LED technology nevertheless involves specific management of the heat generated by the various components of the light-emitting module. In effect, the heat generated leads to an increase in the temperature at the level of the components that can degrade the components and/or prevent optimum use thereof.

The existing solutions for managing this heat are not the optimum for high dissipated powers, notably greater than 25 W, in a light-emitting module. For example, the existing solutions generally have various disadvantages at the level of the light-emitting module and/or a light-emitting device incorporating the light-emitting module. These drawbacks can include a relatively large overall size of the components necessary for management of the heat to provide cooling and optical performance, whether that be cooling by natural or forced convection, and/or relatively lengthy, complicated and/or costly manufacture.

SUMMARY OF THE INVENTION

There is therefore proposed a light-emitting module of terrestrial vehicle comprising at least one semiconductor light source including a substrate. The substrate consists mostly of semiconductor material. The substrate has a first face and a second face. The light source further includes electroluminescent elements with submillimeter dimensions extending from the first face of the substrate. The module also includes at least one heatsink cooperating with the second face of the substrate to evacuate the heat produced by the light source.

In various embodiments the light-emitting module can have one or more of the following features combined with one another:
  the electroluminescent elements have a rod shape;
  the rods extend orthogonally to the substrate;
  rods have a cylindrical general shape, notably of polygonal section;
  each rod has a diameter between 0.5 µm and 2.0 µm inclusive, preferably 1 µm;
  each rod has a height between 1 µm and 10 µm inclusive, preferably 8 µm;
  the distance between two immediately adjacent rods is between 3 µm and 10 µm inclusive;
  the distance between two immediately adjacent rods is constant or variable;
  the luminance of the rods is at least 60 Cd/mm$^2$, preferably at least 80 Cd/mm$^2$;
  the rods are adapted to emit light rays along the rod (i.e. in a direction perpendicular to a majority extension plane of the substrate) and at the end thereof;
  the first face and the second face are substantially parallel to each other;
  the semiconductor material includes silicon;
  the electroluminescent elements are divided between different and selectively activatable light-emitting zones;
  the substrate is supplied with electricity via a printed circuit, the printed circuit skirting the substrate;
  the substrate is supplied with electricity by a printed circuit directly or via an intermediate component supplied with electricity by the printed circuit and supplying the substrate with electricity;
  the intermediate component is supplied with power by the printed circuit directly;
  the electrical component is the electronic device for controlling the electroluminescent elements;
  the substrate is supplied with electricity by the printed circuit via wire bonding;
  the wire bonding is between the printed circuit and the substrate and/or between the printed circuit and the intermediate electrical component;
  the substrate is supplied with electricity by the printed circuit via a welded joint;
  the welded joint is between the printed circuit and the substrate and/or between the printed circuit and the intermediate electrical component;
  the welded joint is on a conductive layer of the printed circuit;
  the substrate is supplied with electricity by the printed circuit via an electronic device for controlling the electroluminescent elements, the module including wire bonding between the printed circuit and the electronic device and a soldered joint between the electronic control device and the substrate;
  the printed circuit is flexible;
  the heatsink is arranged against the second face of the substrate via an intermediate component;
  the intermediate component forms a thermal bridge consisting of a set of one or more consecutive materials from the substrate to the heatsink, each material of the thermal bridge having a thermal conductivity greater than 1 W/(m·K);
  the one or more materials comprise one or more thermal pastes;
  the one or more materials comprise one or more electrically conductive metals;
  the one or more materials comprise copper;
  the intermediate component comprises one or more layers of thermal paste;
  the intermediate component comprises one or more layers of copper;
  the intermediate component comprises a thermal paste;
  the thermal paste is electrically insulative;
  the intermediate component comprises a layer of copper;
  the layer of copper covers at least a part of the heatsink;
  the copper layer covers at least a part of the second face;
  the light source is stuck or welded to the heatsink;

the light source is in direct contact with the heatsink;
the light source is in contact with the heatsink via the intermediate component;
the module further comprises an electronic device for controlling the electroluminescent elements;
the electronic device comprises at least one power converter and/or one integrated circuit;
the integrated circuit comprises an ASIC and/or an ASSP;
the electronic device is arranged on the second face of the substrate;
the intermediate component comprises one or more electronic control devices, each electronic control device being configured to control a respective set of light-emitting semiconductor elements with their respective electrically conducting tracks to ensure operation;
the heatsink comprises one or more finned radiators;
the heatsink has a thermal conductivity greater than or equal to 0.2 W/(m·K), preferably greater than equal to 1 W/(m·K), more preferably greater than or equal to 5 W/(m·K);
the heatsink includes magnesium and/or aluminum and/or copper and/or a thermally conductive polymer;
the heatsink includes a cavity able to receive at least the electronic device;
the cavity has a bottom;
the bottom is in contact with the heatsink;
the cavity is a hole through the heatsink;
the electronic device passes at least partly through the heatsink;
comprising a second heatsink cooperating with the electronic device;
in which the second dissipator has a shape substantially complementary to the cavity;
the heatsink comprises a plate;
the plate comprises a first side and a second side;
the first side cooperates with the substrate and the second side includes cooling fins;
the cooling fins project from the second side;
the module further comprises a heat distribution system integrated into the substrate;
the heat distribution system has an area equal to or greater than the area of the zones carrying the electroluminescent elements; and/or
the heat distribution system comprises one or more micro-heatpipes.

There is also proposed a light-emitting device, notably a lighting and/or signaling device, preferably for terrestrial vehicles, comprising at least one light-emitting module as proposed hereinabove.

The device can comprise a first light-emitting module as proposed hereinabove and a second light-emitting module as proposed hereinabove, the first separate from the second.

The heatsink of the first light-emitting module can be in one piece with the heatsink of the second light-emitting module.

The device can be configured to implement a photometric, notably statutory function.

The light-emitting device can be a motor vehicle front headlight.

BRIEF DESCRIPTION OF THE FIGURES

Other features and advantages of the invention will become apparent on reading the following detailed description of the invention given by way of example and with reference to the appended drawings, in which.

DETAILED DESCRIPTION

Figure 1:
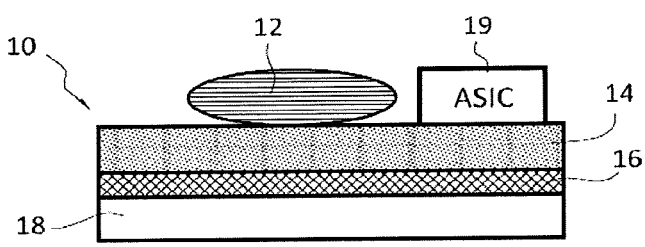
FIG. 1 shows diagrammatically a prior art light-emitting module.

There is proposed a light-emitting module of a terrestrial vehicle and a light-emitting device comprising one or more versions of such a light-emitting module. The light-emitting device can constitute or be integrated into a light projector. The light-emitting device can be a front headlight, a rear light or a light-emitting device for the passenger compartment. There is also proposed a terrestrial vehicle comprising one or more versions of such a light-emitting device (for example one or more pairs of versions at the front and/or one or more pairs of versions at the rear for a four-wheel vehicle or one or more versions at the front and/or one or more versions at the rear for a two-wheel or three-wheel vehicle).

The light-emitting module comprises at least one semiconductor light source including a substrate mostly of semiconductor material. The substrate can therefore be referred to as the "semiconductor substrate". The substrate can include one or more other materials, for example non-semiconductor materials.

The light source also includes one or more sets of electroluminescent elements extending from a first face of the substrate. Consequently, the light-emitting module comprises at least one plurality of such elements extending from the first face of the substrate. Each set is constituted of a plurality of elements extending from a respective portion of the first face of the substrate. The electroluminescent elements can therefore be divided between different light-emitting zones. In one example, those various zones can be activated selectively. The elements can have the general shape of a rod and therefore be referred to as "rods".

Like the substrate, the electroluminescent elements can each be a semiconductor, i.e. each can include at least one semiconductor material. The electroluminescent elements can consist mainly of semiconductor material. That semiconductor material can be the same as or different from the semiconductor material of the substrate. More generally the electroluminescent elements can all be produced in the same material or materials. The electroluminescent elements can be of the same kind, for example substantially identical or similar. All the electroluminescent elements of the same set can be parallel and extend in the same direction. All the sets can extend in the same direction. The direction can be orthogonal to the substrate.

The elements emit light. This means that they emit light when the material of the electroluminescent elements is supplied with electricity. The electroluminescent elements of the same set can form a group cooperating to implement a photometric function. The electroluminescent elements can be supplied with electricity on one side via the substrate (the substrate forming the cathode for example) and on the other side via a layer of electrically conductive material that electrically interconnects the electroluminescent elements (the layer of electrically conducting material forming the anode for example). The contact between the semiconductor material of each light-emitting element and the semiconductor material of the substrate can therefore be suitable for electrical conduction. The layer of electrically conductive material can cover the electroluminescent elements. The layer of electrically conductive material can also cover each surface portion of the substrate from which the electroluminescent elements extend or all of a surface or face of the substrate from which the sets of electroluminescent elements extend. The layer of electrically conductive material can be electrically insulated from the semiconductor material of the substrate by any means. This enables the electroluminescent elements 22 to be supplied with electricity by the substrate. Thus the electroluminescent elements can be supplied with electricity simply, i.e. by supplying the conductive material of the substrate with one polarity and the layer of electrically conductive material with the other polarity.

The light source can therefore form a light-emitting component, here configured in terms of specifications and performance for a terrestrial vehicle. This component differs from conventional LEDs that emit light from one or more substantially plane or at least convex or regular surfaces (for example less than ten such surfaces, e.g. of the order of five). The light source notably enables reduction of the overall size. The light source can moreover form an entire component of individual size greater than a conventional LED, for example in terms of diameter, i.e. the length of the largest segment crossing the component. This simplifies the production of the light-emitting module because fewer components are necessary for a required photometric function. The light source also enables a relatively high luminance.

The light-emitting module can comprise a plurality of such light sources or a plurality of light-emitting modules comprising such a light source can be integrated into the light-emitting device.

The light source can be produced by a method comprising at least one step of procuring the substrate, then a step of integral formation of the rods with the substrate by growth from the substrate. The layer of electrically conductive material can be produced by a step of depositing a metal, for example copper, finish for controlling the rods. This step can equally comprise the creation of aluminum or copper pads on a face of the substrate for wire bonding between the source and the control component. The wire bonding or "bridging" (also referred to as wirebonding or ribbon bonding) is one technique used to make the electrical connections between the light source and the power supply device of the source. The wire bonding is simply produced by a wire (or bridge) welded between two connecting areas provided for this purpose on each of the elements. The welding can be ultrasound welding. The material of the wire can be aluminum, gold or copper. The diameter of the wire can be of the order of 20 μm. A wire of rectangular section can also be used.

The light source otherwise also enables simple production of the light-emitting module. In effect, the limited efficacy in terms of emission of light of conventional LEDs is usually compensated either by increasing the input power or by multiplying the number of LEDs and/or optical modules incorporating an LED. The latter two forms of compensation commensurately increase the overall size of the light-emitting module. Moreover, the forms of compensation referred to above have the disadvantage in modules incorporating a conventional LED of increasing the heat generated, which can lead to a further increase in overall size because of the additional cooling systems that have to be provided.

Figure 2:
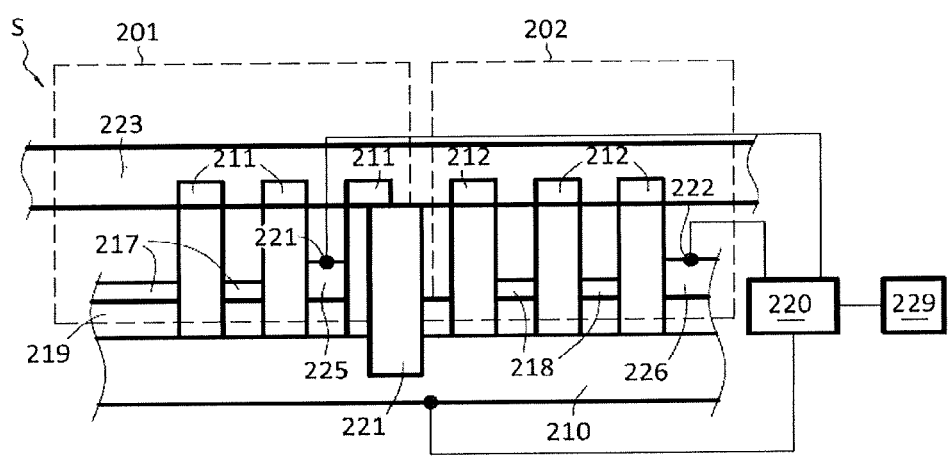
FIG. 2 represents diagrammatically a portion of the light source of one example of a light-emitting module according to the invention.

FIG. 2 shows an example of such a light source.

The light source S, here shown in section, comprises a substrate 210 from which rods 211, 212 extend in a preferred direction.

In this example in particular this substrate 210 consists of silicon, which has a much lower cost than that of conventional LEDs, in which the substrates consist of sapphire. The rods 211, 212 can be produced by crystal growth on this substrate 210.

The rods 211, 212 are adapted to form rods of a light-emitting semiconductor material. The rods 211, 212 can consist essentially of gallium nitride for example.

For example, these rods 211, 212 comprise a semiconductor material core that can be doped with electrons and around which is formed a first layer of semiconductor material that can feature holes, in which case reference is sometimes made to a layer doped with "holes" or positive charges. At the interface of this core and this first layer is formed an intermediate layer in which the electrons and the holes recombine. Each rod 211, 212 is therefore a semiconductor light-emitting element.

A nucleation layer 219 is formed on the substrate 210 and around the rods 211, 212.

Here the rods 211, 212 are approximately 30 μm apart and each has a height from the nucleation layer 219 to their top of 2.5 μm. Their diameter is 1.5 μm.

The light source S therefore essentially comprises a substrate 210 forming a plate bristling with a multitude of small rods 211, 212 emitting light and of sub-millimeter size, i.e. the greatest dimension of which is less than one millimeter.

The light source S is divided into a plurality of light-emitting zones 201, 202 separated by walls 221 corresponding to a distribution of all of the rods 211, 212.

Between the rods 211, 212 of the same zone 201, 202 is deposited an electrically conductive layer electrically connecting those rods, thus forming a separate anode 225, 226 for each of the light-emitting zones 201, 202.

The four anodes 225, 226 formed in this way are in contact with the nucleation layer 219 which is itself is contact with the cathode formed by the substrate 210.

By connecting the anodes 225, 226 and the cathode 210 to a power supply it is therefore possible to supply each of the various light-emitting zones 201, 202 with electricity independently.

According to one embodiment, each anode is connected to one or more positive terminals of connecting means 220 intended to be connected to the positive terminal of an electrical power supply (not shown) of a vehicle. Likewise, the cathode 210 is connected to the negative terminal of the connecting means 220. The activation means therefore enable the supply of electricity to each of these light-emitting zones 201, 202.

It is therefore possible to control this light source S by selective activation of its light-emitting zones 201, 202 via the activation means 220.

Control can be provided either by dedicated means separate from the light-emitting device or, as in this example, by a control device 229 integrated into the light-emitting device.

In this example direct control by a control device 229 is used. The latter is connected on the one hand to the connecting means 220 and on the other hand to the connector C. The connecting means 220 are connected to each anode 225, 226 via electrical conductors.

The control device 229 and the light source S are mounted on the same printed circuit board, not shown. The electrical conductors are formed by electronic tracks of that printed circuit board. Likewise, other electronic tracks connect the connecting means 220 to the control device 229.

The light output of the luminous zones 201, 202 can be improved by depositing a reflecting layer 217, 218 on the nucleation layer 219. That reflecting layer 217, 218 is deposited on the nucleation layer 219 before growing the rods, for example, after which holes are produced in this reflecting layer 217, 218 and in the nucleation layer before growing the rods 211, 212 on the substrate 10.

To obtain a higher light output, the rods of the luminous zones can have the following characteristics:
- a diameter between 1.4 µm and 1.6 µm inclusive, for example 1 µm,
- a height between 2 µm and 10 µm inclusive, for example 8 µm,
- a distance between rods between 3 µm and 10 µm inclusive.

The light source S can comprise a light converter 223 arranged above the rods 211, 212. A light converter comprises at least one luminescent material designed to absorb at least some excitation light emitted by a light source and to convert at least some of said absorbed excitation light into emission light having a wavelength different from that of the excitation light. The material may be YAG doped with cerium or europium, for example.

The light-emitting module further comprises at least one heatsink associated with the substrate of the light source. The heatsink enables the transfer of heat from the substrate or substrates of the light source when a light-emitting module is in use, notably in the context of a terrestrial vehicle. The light source and the cooperation between the heatsink and the substrate of said light source therefore enable a terrestrial vehicle light-emitting module to be produced that is simple to produce and to mount in a vehicle light-emitting device, leading to a compact relatively small overall size and a high heat dissipation capacity.

The heatsink enables dissipation of heat via cooperation with the substrate, i.e. the heatsink receives the heat produced by the light-emitting module and stored in the substrate. The heatsink is thus in thermal communication with the substrate. In one example, the heatsink is arranged directly or indirectly against the second face of the substrate. This means that the second face transmits the heat present in the substrate to the heatsink. The heatsink can then dissipate that heat at least in part outside the light-emitting module.

For example, the substrate can have the general shape of a plate, with two opposite faces. The light emitting rods can then extend for example from one of the two faces, and all of them can do this, for example. The heatsink can then be arranged against the other face of the plate. This enables optimization of the number of thermal interfaces, the space and the overall size of the dissipation of heat, the light-emitting module remaining compact.

For optimum dissipation of heat the heatsink can comprise for each set of rods a zone dissipating heat facing the set from the other side of the plate. The heatsink can comprise a zone of this kind common to all the sets of rods or one zone per set of rods. Each zone can in one example feature a face against the plate formed by the substrate substantially identical to or larger than the substrate surface portion carrying the set of rods.

Transmission can be assured by the fact that the heatsink is in one example arranged directly against the substrate. This means that the heatsink is in physical (i.e. material) contact with the substrate.

Nevertheless the heatsink can alternatively be arranged against the substrate via an intermediate element. The intermediate element is arranged between the substrate and the heatsink. The intermediate element can have two opposite faces, one arranged directly against the substrate, the other directly against the heatsink. The intermediate element can comprise a space empty of material (i.e. formed entirely of an air gap) or alternatively include one or more materials (e.g. with no layer forming an air gap) or consist of one or more materials (i.e. substantially no air). To improve the transfer of heat the intermediate element can for example comprise thermal grease or a phase change material. The intermediate element can contain no printed circuit board (PCB). This is made possible by the specific light source used. The intermediate element can contain no layer of material constituting the substrate of a PCB forming a barrier to the passage of heat from the substrate to the heatsink. For example, the intermediate element can have no resin (e.g. epoxy) and/or polymer layer. This enables better dissipation of heat by reducing the number of thermal interfaces compared to the use of PCB.

In all cases, the thermal coefficient of the transmission of heat from the substrate to the heatsink can be greater than or equal to 1 W/m/K. The light-emitting module therefore dissipates heat effectively.

In the case of an intermediate element between the substrate and the heatsink, the intermediate element can comprise a thermal bridge of material between the substrate and the heatsink. In other words, the intermediate element is such that the heat from the substrate is transmitted to the heatsink by conduction along a path along which the material is disposed continuously. The path has no air gap. A thermal bridge of this kind enables better conduction than in the case of the presence of an insulating air gap.

The thermal bridge can consist of a set of one or more materials in succession from the substrate to the heatsink, i.e. all of the materials successively transmitting heat from the substrate to the heatsink. The materials of the set can in one example each have a thermal conductivity greater than or equal to 1 W/m/K, 10 W/m/K, 50 W/m/K or –100 W/m/K. The total thickness of the intermediate element can be between 1 µm and 500 µm. This set of materials can include no resin e.g. epoxy and/or polymer and/or ceramic. The thermal bridge can comprise among its constituent materials one or more thermal pastes. A material of this kind improves the conduction of heat from the substrate to the heatsink by ensuring a good contact between the two components while being electrically insulative. Moreover, the thermal paste can be adhesive. The thermal paste can comprise glue (for example epoxy glue) and/or adhesive glue. This enables fixing by adhesion or gluing in addition to improving the conduction of heat. Any fixing can alternatively or additionally be effected by welding, the thermal bridge then comprising a weld material, for example a metal. The thermal bridge can alternatively or additionally comprise one or more electrically conductive metals, for example copper. This enables good heat distribution and also electrical conduction.

The light-emitting module can comprise one or more electronic devices for controlling the electroluminescent elements. An electronic device of this kind can be an integrated circuit or a power converter, for example.

A power converter is a device for converting an electrical power supply coming from an electrical power supply network of the vehicle into an electrical power supply appropriate for the production of a required lighting function and possibly to provide said appropriate electrical power supply to a light source for the implementation of said required lighting function.

An integrated circuit, also known as an electronic microchip, is an electronic component reproducing one or more electronic functions and able to integrate a plurality of types of basic electronic components, for example in a small volume (i.e. on a small die). This makes the circuit easy to implement.

The integrated circuit can be an ASIC or an ASSP for example.

An ASIC (application-specific integrated circuit) is an integrated circuit developed for at least one specific application (i.e. for a client). An ASIC is therefore a dedicated integrated (micro-electronic) circuit. It generally combines a large number of unique or bespoke functionalities.

An ASSP (application-specific standard product) is an integrated (micro-electronic) electronic circuit combining a large number of functionalities to satisfy a generally standardized application. An ASIC is designed for a more particular (specific) requirement than an ASSP.

If the thermal bridge comprises one or more electrically conductive metals, the electrical conduction enables the integration of electronic devices of this kind in the intermediate elements, which can then be supplied with power via the electrically conductive metal.

The substrate can be supplied with electricity by a printed circuit directly or via the electronic device, which is itself supplied with electricity via the printed circuit, the electronic device then supplying the substrate with electricity, for example directly. For example, the substrate can be supplied with electricity by the printed circuit via an electronic device able to control the electroluminescent elements. The module can comprise wire bonding between the printed circuit and the electronic device and a weld between the electronic control device and the substrate.

The intermediate element can therefore notably comprise one or more such electronic control devices. These electronics can be configured to interact with components of the light-emitting module. In particular, each electronic control device can be configured to control one or more sets of rods of the light-emitting module. The control electronics of the light-emitting module are therefore as close as possible to the heatsink. These electronics also generating heat, this solution enables optimization of heat dissipation. Moreover, this solution enables improvement of the compactness of the light-emitting module, mostly by avoiding the use of an electronic control device separate from the light-emitting module and therefore the provision of additional space and the addition of the necessary connectors.

For example, each electronic control device can be configured to control a respective set of rods. The intermediate element carrying the electronic control device can then face that set of rods. This enables optimization of heat dissipation and of the compactness of the light-emitting module whilst having the control electronics as close as possible to the controlled components.

In this case or in other cases the intermediate element can consist of a stack of layers completely surrounding or retaining on either side an electronic control device. The layers can, for example each layer can, consist of in one of the materials indicated above and thus provide good heat conduction.

The light-emitting module can alternatively or additionally comprise one or more electronic control devices as referred to above, carried by the substrate. Electronic control devices of this kind can for example be welded to the substrate and supplied with electricity via the substrate using standard processes. This also enables improvement of the compactness of the light-emitting module. In effect, in the prior art a driver fixed to the component of an LED module induces self-heating of the LED by the driver, which can reduce the performance in terms of flux. Likewise, the driver is self-heated by the LED, and therefore more thermally sensitive. In the prior art, this can lead to increasing the size of the heatsink for a given cooling target.

The advantages of the light-emitting module in terms of heat dissipation examples are described next with reference to FIG. 1, which show a prior art solution.

FIG. 1 shows diagrammatically a prior art light-emitting module. FIG. 1 represents a motor vehicle light-emitting module 10 comprising a light source 12, for example an LED, a PCB 14, a thermal interface 16 comprising grease, and a heatsink 18. The device 19 controls the light source 12 and provides the lighting and/or signaling function of the module 10. As can be seen in the figure, the heatsink 18 cooperates with the PCB 14. The PCB 14 has thermal resistance and therefore impedes the conduction of heat from the LED 12 to the heatsink 18. This reduces the effectiveness of cooling in the case of systems necessitating a large emitting and dissipating area larger than individual LEDs on one or more dies or "chips" and/or necessitating higher performance and therefore an operating temperature of the source lower than in conventional modules.

In contrast the light source enables the PCB to be dispensed with and the heatsink to be arranged against the substrate. The substrate then has the function of a support for fixing to the heatsink, potentially via the intermediate element.

Various examples of characteristics of the light source are discussed next. These examples notably make it possible to simplify the support function of the heatsink and/or to improve luminescence and/or heat dissipation.

The light source can have a structure enabling generation of emission sources of individual size strictly greater than 50 µm*50 µm, for example greater than 75 µm*75 µm, or even greater than or of the order of 100 µm*100 µm. The substrate can for example take the form of a die the width and the length of which have corresponding values. These dimensions enable the substrate to carry an effective heatsink, even in the case of a single set of rods. The size and their close spacing of the emission source enable better heat distribution than conventional LED sources (for example of multichip type), the size of which is generally less than 50 µm*50 µm. The dimensions and the conduction characteristics of the substrate can be used to glue or to weld the LED to a heatsink, possibly via an intermediate element. This enables elimination of the PCB. The technology for connecting the power supplies can consist in integrating the conductive layer into the substrate.

The dimensions of each rod are sub-millimeter dimensions. This means that substantially every dimension of each rod is less than one millimeter. The rods can for example have a height greater than 1 µm, 3 µm, or 5 µm, and/or less than 50 µm, 25 µm, or 15 µm, for example of the order of 8 µm. The rods can have a section diameter (i.e. the greatest length of the section) that is constant or varies. The greatest diameter or the (constant) diameter can be less than 15 µm, 10 µm, or 3 µm, and/or the smallest diameter or the (constant) diameter can be greater than 0.05 µm, 0.1 µm, or 0.5 µm, for example of the order of 1 µm. The rods can have a section of any shape, for example a circular or polygonal, for example pentagonal or hexagonal, general shape. The pitch or distance from one rod to the nearest rod or rods (i.e. the distance between two immediately adjacent rods) can be non-zero, i.e. there is a gap between the rods. This spacing can be variable. It can vary in a range a lower limit of which is greater than 0.5 µm or 1 µm and/or less than 5 µm or 4 µm, for example substantially equal to or of the order of 3 µm, and/or the upper limit of which is less than 50 µm, 25 µm, or 15 µm and/or greater than 5 µm or 7 µm, for example substantially equal to or of the order of 10 µm.

The semiconductor material of the substrate can comprise silicon and/or silicon carbide. The semiconductor material (respectively the substrate) can consist mostly of silicon, i.e. the silicon content of the semiconductor material (respectively the substrate) is greater than 50%. Silicon is particularly economical and conducts heat well.

The luminance of the light emitting rods can be greater than 40 Cd/mm$^2$, 50 Cd/mm$^2$, or 60 Cd/mm$^2$. Each rod can emit light rays along its height (i.e. along a direction perpendicular to a majority extension plane of the substrate) and at the end thereof. The substrate can have a first face through which light is emitted and a second face cooperating with the heatsink. The rods can be carried by the first face. The first face and the second face can be substantially parallel to each other. The heatsink can cover the light source either totally or only partly.

Two schematic examples of the light-emitting module are described next with reference to FIGS. 3-6, the figures not being to scale.

Figure 3:
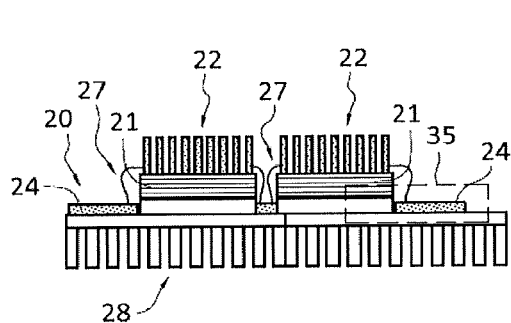
FIGS. 3-12 illustrate diagrammatically various examples of light-emitting modules and/or light-emitting devices according to the invention.
Figure 4:
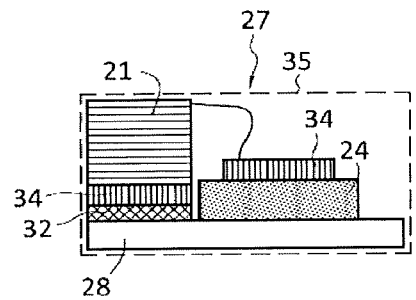
Figure 5:
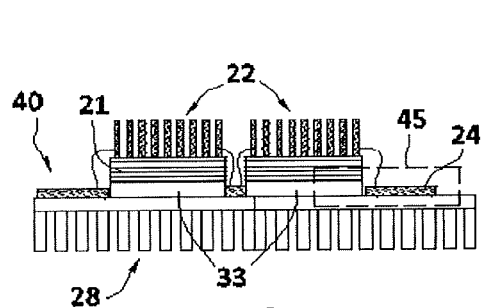
Figure 6:
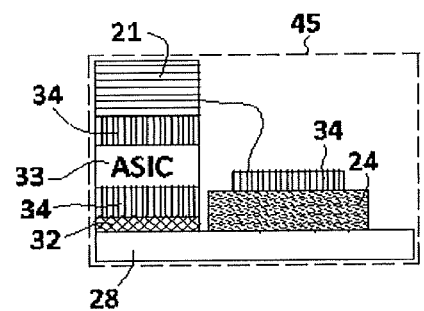

The module 20 according to the example from FIGS. 3-4 and the module 40 according to the example from FIGS. 5-6 each comprise two light sources. Each light source comprises a substrate 21 and a single set of rods 22 extending from the substrate 21. In the two examples the module 20, 40 comprises a heatsink 28 arranged against the substrates and covering the two light sources 21-22. Each substrate 21 is in the form of a die. The rods 22 extend from a first face (upward in the figures). And the heatsink 28 is arranged against the second face. In the examples, the heatsink 28 is represented in the form of a single finned radiator formed integrally with and cooperating with the two substrates 21. The heatsink 28 is thus formed of two sub-heatsinks in one piece and each cooperating with a separate substrate 21. But the module can alternatively comprise a plurality of finned radiators (for example one per substrate 21 and/or per set of rods 22) and/or other types of heatsinks.

In the two examples, the heatsink 28 is arranged against each substrate 21 via an intermediate element (32-34). The intermediate element of the module 20 from the example from FIG. 3 is shown by enlarging the zone 35 of the module 20 represented by FIG. 4. Likewise, the intermediate element of the module 40 of the example from FIG. 5 is shown by enlarging the zone 45 of the module 40 represented by FIG. 6.

The intermediate element of the module 20 comprises in succession from the heatsink 28 to the substrate 21 a layer 32 of adhesive thermal paste and a layer 34 of copper. The copper layer 34 of the zone 35 of the module 20 enables output of electrical current from the substrate 21.

The intermediate element of the module 40 comprises in succession from the heatsink 28 to the substrate 21 a layer 32 of adhesive thermal paste, a layer 34 of copper, an ASIC 33, and another layer 34 of copper. The copper layers 34 enable the ASIC 33 to be supplied with electricity. Each ASIC 33 can be configured to control a respective light source 21-22. Each ASIC 33 can be arranged facing the controlled light source. Control is therefore particularly effective. The solution is compact. The ASICs 33 benefit from the dissipation of heat by the heatsink 28. In the two examples, the substrate 21 is supplied with electricity via a printed circuit board (PCB) 24. Unlike the prior art represented in FIG. 1, the PCB 24 does not form part of the intermediate element with the heatsink 28. In effect, the PCB 24 skirts the substrate 21, which means that the PCB 24 does not face the second face of the substrate 21. This is made possible and easily achieved thanks to the configuration of the light sources 21-22 and notably by the access from the outside to the electrically conductive substrate 21.

For example, the PCB 24 is made as a number of parts assembled to leave a gap (e.g. hole or orifice) between them or a single part featuring a hole and the substrate 21 cooperates with the heatsink 28 via the gap or hole. The PCB 24 therefore delimits the zone where the intermediate element 32-34 can operate against the heatsink 28. The intermediate element 32-34 is arranged at least partly in this space or hole. The substrate 21 is arranged at the level of this hole, above the hole in the examples shown in the figures. The semiconductor electroluminescent elements extend from one side of the PCB 24 (upward in the figures), the heatsink 28 being arranged against the second face of the substrate 21 on the other side of the PCB 24 (downward in the figures).

In the example from the figures the PCB 24 is fixed to the heatsink 28, as seen in FIGS. 4 and 6. The PCB 24 and the assembly consisting of each light source 21-22 and its cooperating intermediate element 32-34 are therefore against the heatsink 28 and the PCB 24 skirts said assembly. In the example from the figures, the substrate 21 is supplied with electricity via the PCB 24 via wire bonding 27. The substrate 21 in turn supplies power to the rods 22. Alternatively, the substrate 21 could be supplied with electricity via the PCB 24 via a weld between the substrate and a conductive layer of the PCB. The electrical current may for example be fed via the front face of the substrate 21 (the side with the rods 22). In this case the light sources can be in series or in parallel and supplied with power via the wire bonding.

A light-emitting device can comprise one or more light sources on the same substrate according to any of the various embodiments described up to this point. The device shares the same heatsink, as discussed with reference to FIGS. 3-6. In the case of a plurality of light-emitting sources on the same substrate, the sources can be offset relative to one another. One advantage is to be able to control sources individually.

The light-emitting device can be configured for lighting and/or signaling in a terrestrial vehicle, for example a motor vehicle. The light-emitting device can be configured to implement a photometric function. A photometric function is for example a lighting and/or signaling function visible to the human eye. In the automotive field this photometric function can conform to the regulations in force in the country in which it is used and can then be referred to as statutory. The statutory photometric functions comprise for example at the date of filing the present application: daytime running light (DRL), UNECE regulation 087, position light, UNECE regulation 007, low beam light, UNECE regulation 87, high beam light, reversing light, UNECE regulation 023, stop light, UNECE regulation 007, turn indicator, UNECE regulation 006, fog lamp, UNECE regulations 019 and 038. The regulations can contain requirements as to colorimetry, intensity, spatial distribution according to a so-called photometric grid or areas of visibility of the emitted light.

As indicated with reference to the examples, the heatsink can generally comprise one or more finned radiators. The heatsink can for example comprise a plate having a first side and a second side. The first side cooperates with the substrate and the second side includes cooling fins. The cooling fins project from the second side. The heatsink can be made from a material that has a thermal conductivity greater than or equal to 5 W/(m·K), greater than or equal to 50 W/(m·K), or greater than or equal to 100 W/(m·K) for lighting functions. The heatsink can for example be made either of metal or of conducting plastic or consist of a composite material. The heatsink can for example include magnesium and/or aluminum and/or copper and/or a thermally conductive polymer. These features contribute to a simple implementation but one that ensures good cooling. These heatsinks can be cooled by natural or forced convection as required.

To improve heat dissipation the substrate of the light-emitting module can integrate a heat distribution system integrated into the substrate. The heat distribution system distributes heat substantially homogeneously in the part of the substrate cooperating with the heatsink. The capabilities of the heatsink are therefore used in full and heat dissipation is optimized. The heat distribution system can have an area equal to or greater than that of the zones carrying the electroluminescent elements. The heat distribution system can for example comprise microheatpipes. This enables particularly effective heat dissipation, in particular in the configuration in which the intermediate element comprises one or more electronic control devices.

The heat distribution system can be configured to distribute the heat correctly to the heatsink to maximize its effectiveness by integrating one or more microheatpipes into the structure of the substrate, consisting for example of silicon. The microheatpipes can be formed of capillary networks that enable the liquid to be drained from the hot zone of the source and the ASIC to the cold zone. A microheatpipe can be etched using standard microchip fabrication processes. These intelligent cooling means integrated into the light source enable better control of heat by spreading the hot point toward the heatsink.

Figure 7:
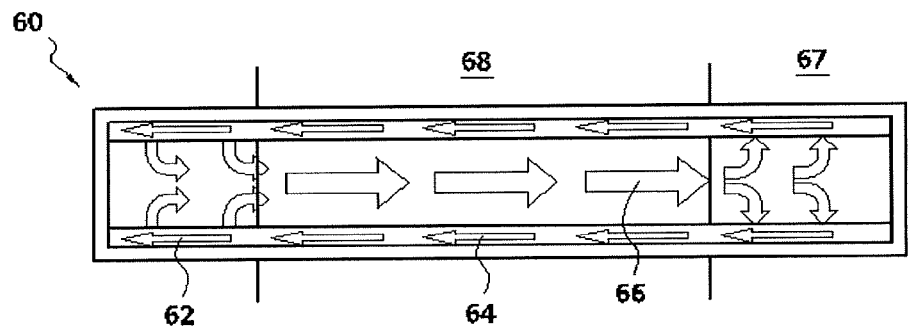

A microheatpipe consists of networks of a few millimeters in which a fluid evaporates and is transported in the vapor phase toward the cold zone. Because of the short length (for example less than 20 cm), the capillary effect enables operation without gravity assistance. FIG. 7 illustrates the operating principle of a microheatpipe 60. The fluid is represented by the arrows. The fluid circulates in liquid form 64 in the capillary network 62 of the microheatpipe 60, enters the vapor phase 66 in a zone forming an evaporator, crosses an adiabatic zone 68, and then returns to the liquid form in a zone 67 forming a condenser, and so on.

Figure 8:
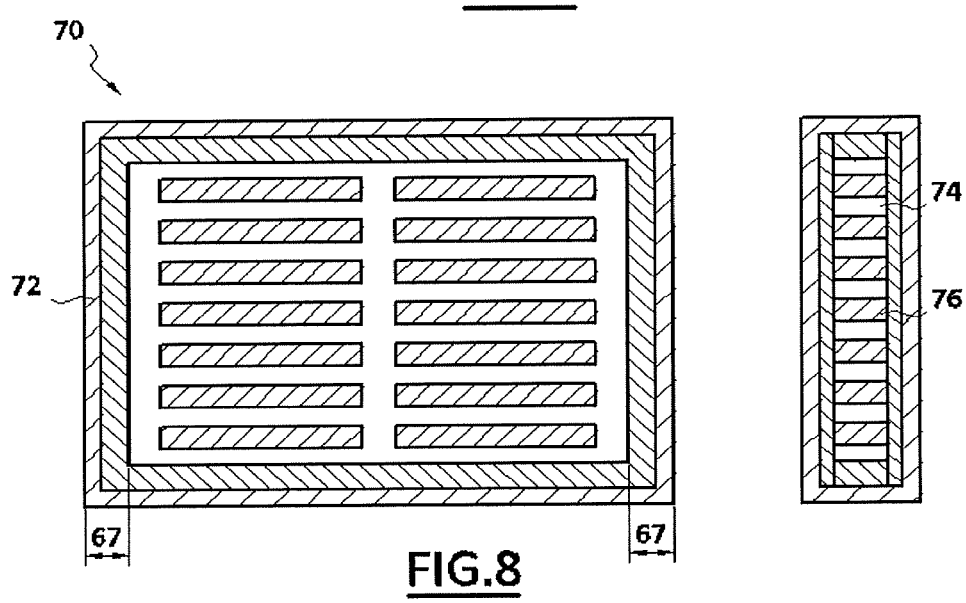

The interior of the microheatpipe can comprise materials having either an irregular structure produced by sintering a powder or grooves. A microheatpipe of flat shape can be inserted into a preform defined directly in the substrate or alternatively in a conductive material to enable the heat to spread. The microheatpipe can comprise parallel grooves filled with fluid. FIG. 8 illustrates an example of one such microheatpipe 70. A capillary network is defined between the walls 72 of the microheatpipe 70. The condensation occurs in zones 67 flanking the sintered grooves 76 and the vapor spaces 74.

Figure 9:
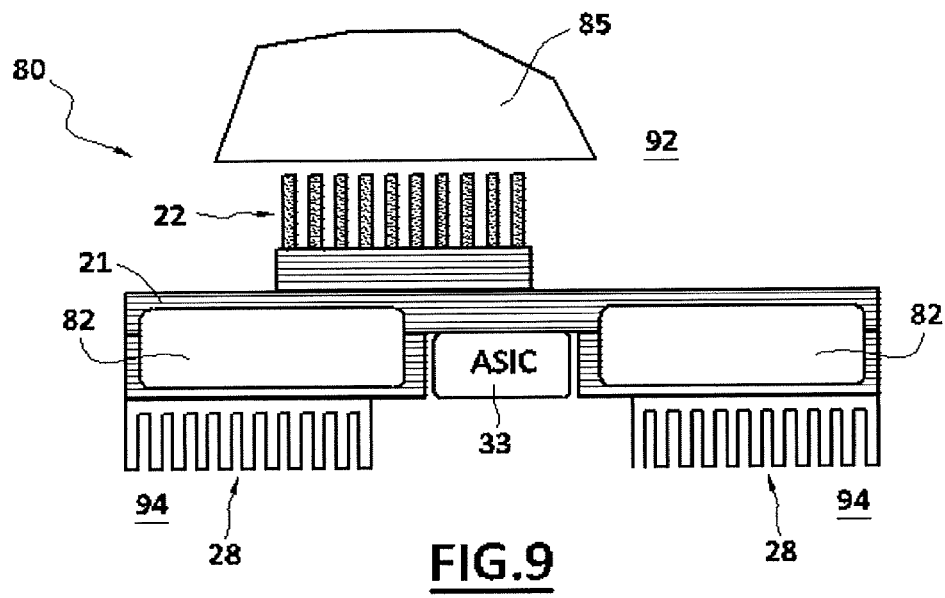
Figure 10:
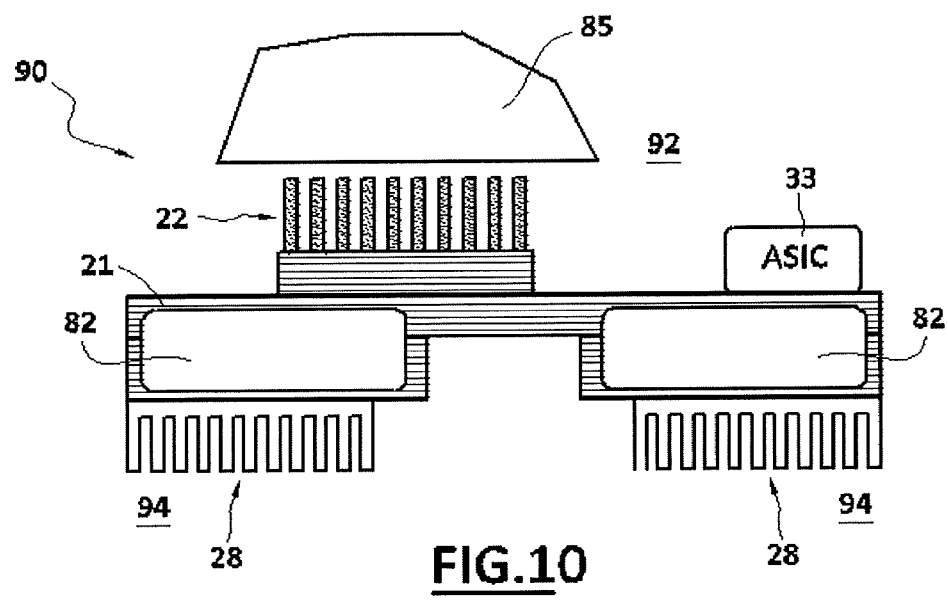

FIGS. 9-10 show other diagrammatic examples of the light-emitting module integrated into a light-emitting device and comprising microheatpipes, the figures not being to scale.

FIG. 9 shows an example of a light-emitting device integrating a light-emitting module 80 and a lens 85. The light-emitting module 80 comprises the substrate 21 and the rods 22 together with the ASIC 33. The heatsink 28 is in two parts each arranged against the substrate 21 below the light-emitting device 80 (in the orientation shown in the figure). The heatsink could be in one piece and cover all of the lower face of the module. The substrate 21 integrates two sets of microheatpipes 82. The microheatpipes 82 enable good distribution of the heat in the substrate before transmission to the heatsink by exploiting the hot zone 92 and the cold zone 94 as indicated above.

FIG. 10 shows a light-emitting device that differs from the light-emitting device from FIG. 9 in that the ASIC 33 of the light-emitting module 90 is arranged above the substrate 21 (in the orientation shown in the figure). In this case, in contrast to the embodiments of FIGS. 5-6 and 9, the ASIC can be electrically connected by wire bonding, for example. The ASIC could equally well be situated at the level of the intermediate element between the heatsink 28 and the substrate 21, and therefore below a heat pipe 82 in the orientation shown in the figures, as described with reference to FIGS. 5-6.

The printed circuit board (PCB) for supplying power to the substrate can be rigid. In an alternative example the PCB can be a flexible printed circuit board (FPCB). The light-emitting module then enables flexible supply of electricity at the same time as reducing the inherent heat dissipation limitations. In another example, the module comprises instead of a rigid PCB or an FPCB a variable geometry interconnection device, notably of the MID (molded-in device) type.

The LED source on flexible PCB application can be of interest for complicated product shapes or complicated light distribution such as DRL around a headlight, rear light functions, or lighting component contour functions for interior lighting. A flexible PCB dissipates heat badly, however, notably because of the adhesive layer of the last layer of copper on the heatsink plate. This layer has the mechanical stiffener function.

The light-emitting device configuration in which the substrate is supplied with electricity via a PCB that circumvents the substrate, as described by way of example with reference to FIGS. 3-6, enables good heat dissipation at the same time as preserving the advantages of the flexible PCB. In effect, the flexibility of the connection between different parts is exploited, but the flexible PCB and the stiffening adhesive layer do not impede the dissipation of heat linked to the lighting function.

Figure 11:
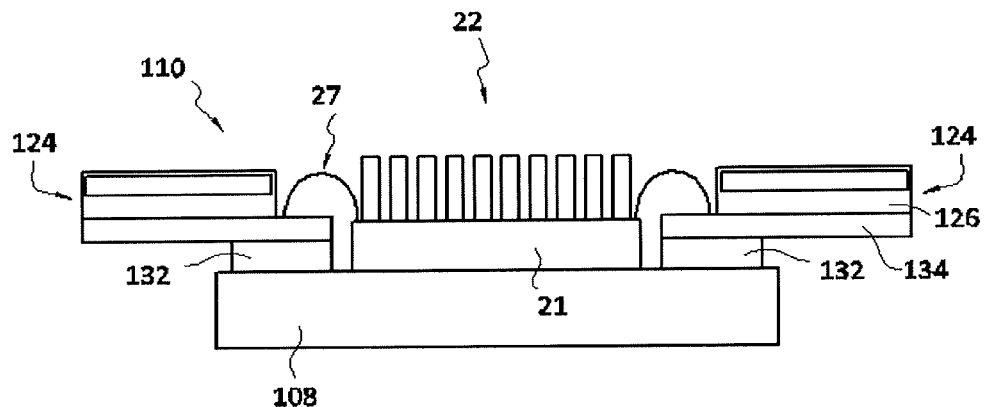
Figure 12:
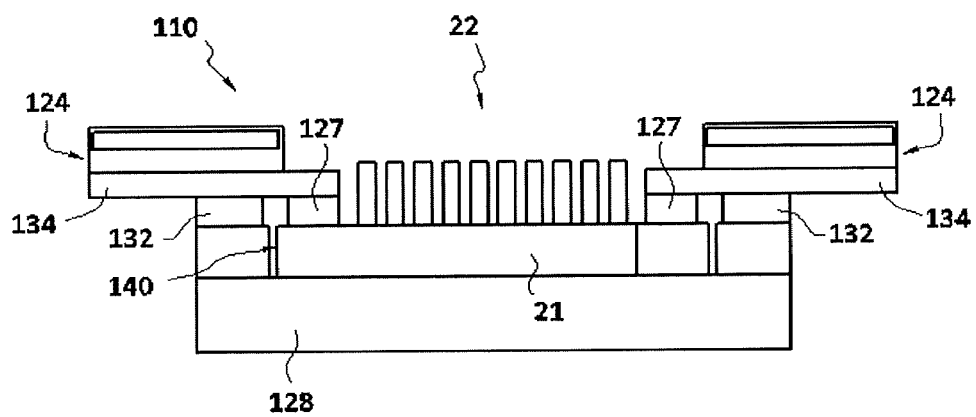

FIGS. 11-12 show other diagrammatic examples of the light-emitting module integrating a flexible PCB, the figures not being to scale.

The light-emitting module 100 from FIG. 11 and the module 110 from FIG. 12 each comprise a light source 21-22 and a heatsink 108, 128 arranged against the substrate 21. For example, the heatsink 108, 128 can be arranged against the substrate 21 as in any of the examples described above, for example via an intermediate element as described above, for example with reference to FIGS. 3-6, the intermediate element not being shown in FIGS. 11-12. The light source 21-22 can for example be fixed to the heatsink 108, 128 by a fixing comprising glue (e.g. heat-conducting glue) or a weld.

The modules 100 and 110 each include a flexible printed circuit board 124. The flexible PCB 124 comprise an adhesive polyamide layer 126 glued to a copper layer 134. Any other type of flexible PCB is suitable. The flexible PCB 124 is fixed to the heatsink by a fixing 132 which can be glue or a weld for example. The flexible PCB 124 supplies each of the light sources 21-22 with electricity. As seen in the figures, the flexible PCB 124 skirts the light source 21, 22 and therefore retains its flexibility. This is made possible by the fact that the heatsink 28 can cooperate with the substrate 21 to cool it without passing through the PCB. The fixing 132 between the heatsink 28 and the flexible PCB 124 is therefore adapted in accordance with the rules of the art to ensure the absence of failure of the FLEX in terms of reliability by auxiliary mechanical connections such as for example riveting or screwing, depending on what is required.

In the FIG. 11 example, the flexible PCB 124 supplies power to the light source 21, 22 via wire bonding 27, as in the example from FIGS. 3-6. In the FIG. 12 example the flexible PCB 124 supplies power to the light source 21-22 via a weld 127 between the substrate 21 and the electrically conductive layer of the PCB, i.e. the copper layer 134 in this example.

Moreover, the module 110 from FIG. 12 differs from the other modules in that the heatsink 128 includes a cavity 140. The cavity 140 forms a housing for the substrate 21, for example of complementary shape to the substrate 21.

Generally speaking, the heatsink can comprise a cavity of this kind forming a housing, for example of complementary shape, for any component of the module, for example the substrate or the intermediate element, notably the electronic control device.

Generally speaking, the heatsink can be overmolded in plastic so as to be open to the outside. This provides effective cooling, notably for thin structures.

The invention claimed is:

1. A light-emitting module of a terrestrial vehicle comprising:
  at least one semiconductor light source including a semiconductor material substrate, the substrate having a first face and a second face, the light source further including electroluminescent elements with submillimeter dimensions extending and grown from the first face of the substrate;
  a circuit board configured to supply power to the at least one semiconductor light source;
  at least one heatsink cooperating with the second face of the substrate to evacuate the heat produced by the light source; and
  at least one intermediate element located between the second face of the substrate and the at least one heatsink,
  wherein the circuit board is laterally displaced from the substrate, the circuit board and the substrate being located above a top surface of the heatsink, and
  wherein the intermediate element includes an adhesive layer and an Application Specific Integrated Circuit ("ASIC").

2. The light-emitting module according to claim 1, wherein the semiconductor material includes silicon.

3. The light-emitting module according to claim 1, wherein the electroluminescent elements are distributed in different selectively activatable light emitting zones.

4. The light-emitting module according to claim 1, wherein the circuit board is a printed circuit board that is flexible.

5. The light-emitting module according to claim 1, wherein the intermediate element includes a thermal paste.

6. The light-emitting module according to claim 1, wherein the intermediate element includes a layer of copper.

7. The light-emitting module according to claim 1, wherein the light source is glued or welded to the heatsink.

8. The light-emitting module according to claim 1 further comprising:
  an electronic device configured to control the electroluminescent elements.

9. The light-emitting module according to claim 8, wherein the electronic device includes at least one of at least one power converter and one integrated circuit.

10. The light-emitting module according to claim 1, wherein the heatsink includes one or more finned radiators.

11. The light-emitting module according to claim 1 further comprising:
  a heat distribution system integrated into the substrate.

12. The light-emitting module according to claim 11, wherein the heat distribution system includes one or more microheatpipes.

13. A light-emitting device, for at least one of lighting and signaling in the terrestrial vehicle, comprising:
  the light-emitting module according to claim 1.

14. The light-emitting module according to claim 2, wherein the electroluminescent elements are distributed in different selectively activatable light emitting zones.

15. The light-emitting module according to claim 2 further comprising:
  at least one intermediate element located between the second face of the substrate and the at least one heatsink.

16. The light-emitting module according to claim 1, wherein the intermediate element further includes a layer of copper.

17. The light-emitting module according to claim 2, wherein the light source is glued or welded to the heatsink.

* * * * *